United States Patent
Jannin et al.

(10) Patent No.: US 9,329,246 B2
(45) Date of Patent: May 3, 2016

(54) METHOD FOR HYPERPOLARIZATION TRANSFER IN THE LIQUID STATE

(71) Applicants: Bruker BioSpin AG, Faellanden (CH); Ecole Polytechnique Federale de Lausanne (EPFL), Lausanne (VD) (CH)

(72) Inventors: Sami Jannin, Lausanne (CH); Joost Lohman, Warwickshire (GB); Geoffrey Bodenhausen, Paris (FR); Klaes Golman, Frederiksvaerk (DK)

(73) Assignees: Bruker BioSpin AG, CH-8117 Faellanden (CH); Ecole Polytechnique Fédérale de Lausanne (EPFL), CH-1015 Lausanne (CH)

( * ) Notice: Subject to any disclaimer, the term of this patent is extended or adjusted under 35 U.S.C. 154(b) by 776 days.

(21) Appl. No.: 13/633,899

(22) Filed: Oct. 3, 2012

(65) Prior Publication Data

US 2014/0091792 A1 Apr. 3, 2014

(51) Int. Cl.
*G01R 33/28* (2006.01)
*G01R 33/30* (2006.01)
*G01R 33/381* (2006.01)
*G01R 33/46* (2006.01)

(52) U.S. Cl.
CPC ............ *G01R 33/282* (2013.01); *G01R 33/307* (2013.01); *G01R 33/381* (2013.01); *G01R 33/4608* (2013.01)

(58) Field of Classification Search
CPC .. G01R 33/282; G01R 33/307; G01R 33/381; G01R 33/4608
See application file for complete search history.

(56) References Cited

U.S. PATENT DOCUMENTS

| | | | | |
|---|---|---|---|---|
| 6,426,058 B1 * | 7/2002 | Pines | ................. | A61K 49/1815 424/9.3 |
| 6,593,144 B2 * | 7/2003 | Albert | ................ | A61K 49/1806 424/9.3 |
| 6,818,202 B2 * | 11/2004 | Pines | ................. | A61K 49/1815 424/9.3 |

(Continued)

FOREIGN PATENT DOCUMENTS

| | | |
|---|---|---|
| EP | 1 746 431 | 1/2007 |
| GB | 2 448 054 | 10/2008 |

(Continued)

OTHER PUBLICATIONS

Roth M. et al., "13C hyperpolarization of a barbituric acid derivative via parahydrogen induced polarization", Journal of Magnetic Resonance, Academic Press, Orlando, FL, US, vol. 264, No. 1, May 1, 2010, Pa. 50-55.

(Continued)

*Primary Examiner* — Dixomara Vargas
(74) *Attorney, Agent, or Firm* — Paul Vincent (57) ABSTRACT

A method for producing a hyperpolarized sample for use in a magnetic resonance investigation has the following steps: a) providing a solid sample (50), containing long T1 nuclei and short T1 nuclei in the same molecules (51); b) hyperpolarizing the short T1 nuclei in the solid sample (50); c) transforming the solid sample (50) into a liquid sample (52); and d) transferring the polarization of the short T1 nuclei to the long T1 nuclei within the molecules in the liquid sample (52) by Cross Polarization. The method can provide samples with hyperpolarized long T1 nuclei, in particular $^{13}$C or $^{15}$N, in a simple and efficient way.

25 Claims, 4 Drawing Sheets

(56) References Cited

U.S. PATENT DOCUMENTS

| | | | |
|---|---|---|---|
| 6,885,192 B2* | 4/2005 | Clarke | G01R 33/0356 324/300 |
| 6,937,020 B2* | 8/2005 | Munson | G01R 33/307 324/320 |
| 7,053,610 B2* | 5/2006 | Clarke | G01R 33/0356 324/300 |
| 7,061,237 B2* | 6/2006 | Pines | A61K 49/1815 324/304 |
| 7,116,102 B2* | 10/2006 | Clarke | G01R 33/0356 324/300 |
| 7,126,332 B2* | 10/2006 | Blanz | E21B 49/00 324/300 |
| 7,205,762 B2* | 4/2007 | Blanz | E21B 49/00 324/300 |
| 7,218,104 B2* | 5/2007 | Clarke | G01R 33/0356 324/300 |
| 7,368,909 B2* | 5/2008 | Blanz | E21B 49/00 324/300 |
| 7,385,395 B2* | 6/2008 | Pines | A61K 49/1815 324/301 |
| 7,466,132 B2* | 12/2008 | Clarke | G01R 33/0356 324/318 |
| 7,474,095 B2* | 1/2009 | Levitt | G01R 33/46 324/300 |
| 7,508,212 B2* | 3/2009 | Fain | G01R 33/345 324/318 |
| 7,550,970 B2* | 6/2009 | Servin | G01R 33/4633 324/307 |
| 7,631,507 B2* | 12/2009 | Stautner | F25B 9/14 324/307 |
| 7,646,200 B2 | 1/2010 | Slade | |
| 8,154,292 B2 | 4/2012 | Bovier | |
| 8,377,419 B2* | 2/2013 | Marcus | 424/1.11 |
| 8,456,162 B2* | 6/2013 | Vasos | G01R 33/282 324/309 |
| 8,703,201 B2* | 4/2014 | Belzer | A61K 49/1806 424/489 |
| 9,140,657 B2* | 9/2015 | Ledbetter | G01N 24/08 |
| 2002/0137965 A1* | 9/2002 | Axelsson et al. | 560/231 |
| 2004/0049108 A1 | 3/2004 | Ardenkjaer-Larsen | |
| 2010/0092396 A1* | 4/2010 | Kovacs et al. | 424/9.363 |

FOREIGN PATENT DOCUMENTS

| | | |
|---|---|---|
| WO | WO 99/35508 | 7/1999 |
| WO | WO 02/37132 | 5/2002 |
| WO | WO 2004/019995 | 3/2004 |
| WO | WO 2004/019996 | 3/2004 |
| WO | WO 2004/019997 | 3/2004 |
| WO | WO 2007/007022 | 1/2007 |
| WO | WO 2008/155093 | 12/2008 |
| WO | WO 2011/026103 | 3/2011 |

OTHER PUBLICATIONS

Angel Joaquin Pérez Linde, "Application of Cross Polarisation Techniques to Dynamic Nuclear Polarisation Dissolution Experiments", Magnetic Resonance Centre the University of Nottingham Nov. 2009.

Jannin, Sami et al., "Low-temperature cross polarization in view of enhancing dissolution Dynamic Nuclear Polarization in NMR", Chemical Physics Letters 517 (2011) 234-236.

Harris, Talia et al., "Kinetics from Indirectly Detected Hyperpolarized NMR Spectroscopy by Using Spatially Selective Coherence Tansfers", Chem. Eur J. 2011, 17, 697-703.

Sarkar, Riddhiman et al., "Proton NMR of $^{15}$N-Choline Metabolites Enhanced by Dynamic Nuclear Polarization", J.Am. Chem. Soc. 2009, 131, 16014-16015.

Mishkovsky, Mor et al., "Localized in Vivo Hyperpolarization Transfer Sequences", Magnetic Resonance in Medicine 68:349-352 (2012).

Moris, G.A. et al., "Enhancement of Nuclear Magnetic Resonance Signals by Polarization Transfer", Journal of the American Chemical Society, 101:3, Jan. 31, 1979.

* cited by examiner

Fig. 4

METHOD FOR HYPERPOLARIZATION TRANSFER IN THE LIQUID STATE

BACKGROUND OF THE INVENTION

The invention relates to a method for producing a hyperpolarized sample for use in a magnetic resonance investigation.

NMR (NMR: nuclear magnetic resonance) techniques may be applied to gather information about a sample or sample area in a gentle, non-destructive way; in particular, clinical investigations on living patients can be done non-invasively. However, NMR techniques are generally limited by low signal intensities.

One way to increase signal intensities is to apply hyperpolarization techniques. Here, nuclei in a sample are prepared with a polarization level higher than corresponding to the Boltzmann distribution at the sample's temperature, and the hyperpolarized nuclei undergo an NMR experiment. In many NMR experiments, information about low $\gamma$/high T1 nuclei, respectively, are of particular interest, above all about $^{13}$C and $^{15}$N ($\gamma$: gyromagnetic ratio or gamma; T1: longitudinal relaxation time).

An important hyperpolarization technique is Dissolution DNP (DNP: dynamic nuclear polarization). In a conventional Dissolution DNP experiment, see e.g. WO1999/035508 A1 or WO 2002/037132 A1, the polarization parameters are chosen to directly polarize the nucleus of interest, typically a low gamma/long T1 nucleus such as $^{13}$C, with microwave radiation. After polarization, the low temperature solid sample is rapidly heated to room temperature by dissolving it in hot solvent and transferred to the location where it is to be measured by NMR, in particular MRI (MRI: magnetic resonance imaging). In order to minimize polarization losses, it has been proposed to arrange the DNP magnet and the NMR magnet in close proximity to each other, compare WO 2007/007022 A1 or U.S. Pat. No. 7,646,200 B2. In U.S. Pat. No. 8,154,292 B2, a shuttle DNP has been proposed, with a sample moving in its container between two magnetic field regions for Overhauser DNP and NMR spectroscopy, respectively.

One disadvantage of hyperpolarization by DNP is the long polarization time, typically in the order of one hour or more. A potential mitigation of this problem is to polarize $^1$H nuclei (which is much more rapid) followed by polarization transfer to the low $\gamma$ nuclei such as $^{13}$C through the application of appropriate RF Cross Polarization pulses. This technique has been demonstrated already (A. J. P. Linde, Doctoral thesis, University of Nottingham, November 2009; S. Jannin et. al., Chem. Phys. Lett., 2011, 517, 234) but it poses serious technical challenges with regards to generating sufficiently strong $B_1$ fields at two Larmor frequencies in a cryogenic region.

An important drawback of the latter hyperpolarization method, wherein hyperpolarization is transferred from $^1$H to $^{13}$C in a solid sample, is a relatively high power of the RF Cross polarization pulses which is required to achieve the polarization transfer. The required power limits the amount of sample that can be prepared; in particular, sample sizes typically required for in vivo MRI applications on living human patients cannot be prepared by state of the art equipment.

In a combination of Dissolution DNP on low $\gamma$/long T1 nuclei such as $^{13}$C or $^{15}$N followed by polarization transfer to $^1$H in the liquid state, protons have been studied with enhanced sensitivity, compare T. Harris et. al., Chem. Eur. J. 2011, 17, 697; R. Sarkar et. al., J. Am. Chem. Soc. 2009, 131, 16014, or M. Mishkovsky et al., Magnetic Resonance in Medicine 2012, 68, 349-352. In these experiments the high polarization levels are largely retained during the dissolution process and the transfer to the NMR magnet because the DNP process was applied to long T1 $^{13}$C or $^{15}$N nuclei. Pulse sequences for such a polarization transfer have been proposed e.g. by G. A. Morris, R. Freeman, J. Am. Chem. Soc. 1979, 101, 760.

It is also known to react parahydrogen molecules with substrate molecules in the liquid phase, and to transfer polarization from the hyperpolarized $^1$H nuclei of the parahydrogen to low $\gamma$ nuclei in the substrate molecule. Variants of this PHIP technique (PHIP: ParaHydrogen Induced Polarization) have been disclosed in WO 2004/19995 A2, WO 2004/19996 A1 and WO 2004/19997 A1. It is also known to transfer polarization form parahydrogen to a substrate molecule in the liquid phase in a catalytic process, compare WO 2008/155093 A1. However, hyperpolarization using parahydrogen is potentially hazardous with respect to the handling of hydrogen gas and less general than DNP, in particular with PHIP requiring precursor molecules providing unsaturated bonds.

In Brute Force hyperpolarization the nucleus of interest is polarized by generating very large thermal polarization at very low temperature and in a very strong magnetic field, followed by rapid heating of the sample. The problem of slow polarization build-up in these techniques is particularly serious because of the exceedingly large T1 values at low temperature, especially for low $\gamma$ spin ½ nuclei such as e.g. $^{13}$C. In a proposed implementation of Brute Force hyperpolarization, see WO 2011/026103 A2, the nucleus of interest is hyperpolarized indirectly by generating very large thermal proton polarization at very low temperature, followed by low field nuclear thermal mixing.

It is the object of the invention to provide a method which can provide samples with hyperpolarized long T1 nuclei, in particular $^{13}$C or $^{15}$N, in a simple and efficient way.

SUMMARY OF THE INVENTION

This object is achieved, in accordance with the invention, by a method for producing a hyperpolarized sample for use in a magnetic resonance investigation, with the following steps:
a) providing a solid sample, containing long T1 nuclei and short T1 nuclei in the same molecules;
b) hyperpolarizing the short T1 nuclei in the solid sample,
c) transforming the solid sample into a liquid sample,
d) transferring the polarization of the short T1 nuclei to the long T1 nuclei within the molecules in the liquid sample by Cross Polarization.

According to the invention, the initial hyperpolarization process of step b) is performed on the sample in the solid state. The hyperpolarization in step b) can in particular be achieved by DNP, which is particularly preferred since DNP is relatively quick and simple to perform and suitable for a wide range of samples. Alternative hyperpolarization techniques which can be applied in accordance with the invention include Haupt effect, Brute Force, or Optical Excitation (in particular Optical Pumping). Generally, by performing the hyperpolarization in step b) in the solid state rather large polarization levels can be achieved, and early losses of polarization due to decay can be minimized; the solid state fits well with a cryogenic temperature (such as at or below 20 K), which is preferred for step b).

The initial hyperpolarization of step b) is performed on the short T1 (high gamma) nuclei such as $^1$H or or $^{19}$F, which accelerates the polarization process as compared to long T1 nuclei (such as $^{13}$C or $^{15}$N). Note that in the course of step b), there may already be some polarization build-up of long T1 nuclei within the sample.

Subsequently, the sample is turned into a liquid state in step c), and then a polarization transfer from the short T1 nuclei to the long T1 (low γ) nuclei (such as $^{15}$N or $^{13}$C) is effected by Cross Polarization in step d). Following step c), the polarization transfer is preferably completed within (at the latest) five times T1 of the short T1 nuclei, in order to keep polarization losses low.

For Cross Polarization, oscillating magnetic fields are applied at the Larmor frequencies of the long T1 nuclei and the short T1 nuclei. RF (RF: radio frequency) pulse sequences known in the art for this purpose, in particular an INEPT sequence (compare G. A. Morris, l.c.), may be used. Cross polarization allows a quick, efficient and reliable polarization transfer, which can be used with a wide range of samples.

The polarization transfer is particularly simple in the liquid state. While in the solid state dipolar coupling (typically corresponding to 50 kHz) is dominant as nuclear interaction, the relevant nuclear interaction in the liquid state is J coupling (typically corresponding to 150 Hz). When effecting the polarization transfer by Cross Polarization, in accordance with the invention, the required RF energy is much smaller in the sample in the liquid state than compared to the sample in the solid state. Liquid state Cross Polarization transfer typically consists of less than ten short RF pulses (typically 10 μs each), whereas solid state Cross Polarization consists of more than two long RF pulses (typically 1 ms each). It is very simple to perform the polarization transfer RF pulses at room temperature on the liquid sample, but very difficult in the solid state at cryogenic temperatures on the solid sample. Since less energy is requires to perform polarization transfer on the liquid sample, larger sample volumes can be addressed.

According to the invention, the short T1 nuclei and the long T1 nuclei are in the same molecules, which enables the polarization transfer in step d) to be performed in a simple and highly efficient manner.

In a preferred variant of the inventive method, the polarizing in step b) causes a level of at least 1%, preferably at least 5%, more preferably at least 20%, most preferably at least 50% of the short T1 nuclei contained in the solid sample to be polarized. If applicable, a hyperpolarization treatment may be continued until the desired polarization level is achieved. High polarization levels after step b) typically result in higher polarization levels of the long T1 nuclei after step d) and thus result in improved NMR signal strength.

Particularly preferred is a variant wherein step b) takes 30 minutes or less, preferably 10 min or less, and more preferably 3 min or less. These values can easily be obtained when doing the hyperpolarization in step b) by DNP, and are particularly suitable for in vivo experiments.

In another advantageous variant, during step c), the solid sample is dissolved in a solvent. This is particularly simple to perform. Typically, the solvent is at an elevated temperature as compared to the sample in the solid state, in order to support the dissolution process. Alternatively, liquefying the solid sample may be done by melting the solid sample, in particular by means of laser heating.

In another preferred variant, before, during or after step c), the solid or liquid sample is transported to a region with a lower static magnetic field $B_0^*$ as compared to a static magnetic field $B_0$ present during step b) and/or to a region with a higher temperature $T^*$ as compared to a cryogenic temperature $T_{cr}$ present during step b). By this means, the conditions for step b) and for step d) may be optimized independently. In general it is preferred that equipment for step b) (such as a microwave container for DNP) is spaced apart from equipment for step d) (such as an RF coil assembly for Cross Polarization), so they do not interfere or obstruct each other. Alternatively, steps b) through d) may be performed at the same position of the sample.

In a preferred further development of this variant, the liquid sample is transported by pushing or pulling it by means of over- or under-pressure through a conduit. This has been proven in practice, and allows a simple and contamination free transport. Note that an additional transport liquid, in particular for pushing the liquid sample, may be used here.

A variant of the inventive method provides that the longitudinal relaxation time $T1_{long}$ of the long T1 nuclei is 5 s or longer, preferably 10 s or longer, more preferably 30 s or longer, most preferably 60 s or longer, and/or that the longitudinal relaxation time $T1_{long}$ of the long T1 nuclei is larger than two times, preferably larger than five times, most preferably larger than ten times the longitudinal relaxation time $T1_{short}$ of the short T1 nuclei. In this variant, the advantages of the invention are particularly pronounced. The inventive method can be used to provide a hyperpolarized sample relatively quickly. The longitudinal relaxation times $T1_{long}$, $T1_{short}$ may be measured in the liquid state at room temperature.

Particularly preferred is a variant wherein the long T1 nuclei are $^6$Li or $^{13}$C or $^{16}$N or $^{31}$P or $^{29}$Si or $^{89}$Y or $^{57}$Fe or $^{83}$Kr or $^{107}$Ag or $^{109}$Ag or $^{115}$Sn or $^{117}$Sn or $^{119}$Sn or $^{199}$Hg or $^{129}$Xe or $^{131}$Xe, and/or the short T1 nuclei are $^1$H or $^{19}$F. These elements are particularly relevant in practice.

In an advantageous variant, in step b) for polarizing the short T1 nuclei by Brute Force, the solid sample is exposed to a static magnetic field $B_0 \geq 10$ T, preferably $B_0 \geq 15$ T, most preferably $B_0 \geq 20$ T, wherein the solid sample is at a cryogenic temperature $T_{cr} \geq 40$ mK, preferably $T_{cr} \geq 20$ mK, most preferably $T_{cr} \geq 10$ mK. At these conditions, particularly high polarization levels of the short T1 nuclei may be achieved.

In another advantageous variant, in step b) for polarizing the short T1 nuclei by DNP, the solid sample, which also includes a polarizing agent, is exposed to a microwave radiation and a static magnetic field $B_0$. DNP allows a relatively quick and simple polarization of the short T1 nuclei, suitable to a wide range of sample types. Typically, $B_0 \geq 1.0$ T (T: Tesla), and often much higher, and the solid sample is at a cryogenic temperature $T_{cr}$, with $T_{cr} \leq 90$ K (K: Kelvin), and often much lower.

Particularly preferred is a further development of this variant which provides that the static magnetic field $B_0 \geq 4.0$ T, in particular $B_0 \geq 6.7$ T, and that an EPR line of the polarizing agent has a width $w_{Pa}$, wherein $w_{Pa} > \frac{1}{2} \omega_{hg}$, in particular $w_{Pa} > \omega_{hg}$, with $w_{Pa} = 2\sqrt{2\log 2} \cdot \sigma$, with $\sigma^2$ being the second moment of the EPR line, and with $\omega_{hg}$ being the Larmor frequency of the short T1 nuclei. With this further development, a relatively broad EPR line (EPR: electron paramagnetic resonance) is chosen, for optimization of the polarization level achievable with the DNP process on the short T1 (high γ) nuclei. Doing the DNP on the short T1 nuclei (such as $^1$H) is much faster than doing the DNP on the long T1 nuclei (such as $^{13}$C) directly, so a relatively high static magnetic field $B_0$ of 4.0 T or more (which in general leads to slower polarization build-up) can be accepted. The high static magnetic field $B_0$ results in higher polarization levels of the short T1 nuclei.

Another further development of this variant provides that during the DNP in step b), the solid sample is at a cryogenic temperature $T_{cr}$ with $T_{cr} \leq 20$ K, preferably $T_{cr} \leq 10$ K, more preferably $T_{cr} \leq 4.2$ K, most preferably $T_{cr} \leq 1.5$ K. Generally, lower cryogenic temperatures lead to higher polarization levels.

Particularly preferred is a further development of the above variant wherein during the DNP in step b), the solid sample is at a cryogenic temperature $T_{cr}$ with $T_{cr} \geq 2.2$ K, preferably $T_{cr} \geq 4.2$ K. By choosing the cryogenic temperature $T_{cr}$ higher, the polarization of the short T1 nuclei can be accelerated; moreover, cooling costs are lower. Particularly preferred is a $T_{cr}$ of 4.2 K (which corresponds to the boiling point of helium at atmospheric pressure).

In another preferred further development, the polarizing agent are nitroxyl radicals, such as TEMPO radicals or TEMPOL radicals. These radicals have relatively broad EPR lines, well suitable as polarization agent for the above variant. In particular, these radicals have shown good results in practice, achieving high polarization levels in relatively short time with $^1$H as short T1 nuclei. Tempo=(2,2,6,6-Tetramethylpiperidin-1-yl)oxyl; Tempol=4-Hydroxy-2,2,6,6-tetramethylpiperidine 1-oxyl.

In an advantageous variant, during step d), the liquid sample is at room temperature. This allows a quick further use of the liquid sample after the end of the polarization transfer of step d), for example when the sample is intended for application to a living human or animal patient. The sample does not need to be heated or cooled (or needs only marginal heating or cooling) after step d) here. Polarization decay after step d) and before beginning of an NMR experiment can be minimized. Further, the equipment for step d) does not need to be arranged in a cryostat, which simplifies the experimental setup. A sample is considered to be at room temperature if it is within +/−10° C. from the temperature of the surroundings. Independent from the temperature of the surroundings, a sample is considered as being at room temperature when the sample temperature ranges between 10° C. and 30° C.

Particularly preferred is a method of magnetic resonance investigation, comprising the steps of
preparing a hyperpolarized sample according to the inventive method or one of its variants described above,
transporting the liquid sample to an NMR device, in particular an MRI device,
and measuring a magnetic resonance signal of the long T1 nuclei of the liquid sample, in particular for metabolic imaging. The inventive method can be well combined both with analytical and (pre-)clinical NMR, using magnetic resonance spectroscopy (MRS) or magnetic resonance imaging (MRI). The inventive method allows, in particular, a preparation of large sample volumes (such as 1 ml or more with ease, typically 3 ml or more) which are often required for metabolic imaging, in particular with humans.

Apparatus for Producing a Hyperpolarized Sample

Within the scope of the present invention is also an apparatus for producing a hyperpolarized sample, the apparatus comprising
a magnet, in particular a superconducting magnet, suitable for generating a static magnetic field $B_0$ in a polarization generation region,
a cryostat, containing a sample holder for the sample in solid and liquid state, wherein the sample holder is located in the polarization generation region,
a holding chamber for the sample in liquid state, located in a polarization transfer region separate from the polarization generation region,
a first transfer conduit connecting a solvent reservoir with the sample holder, and a second transfer conduit connecting the sample holder with the holding chamber,
a field generating device suitable for generating a static magnetic field $B_0^*$ in the polarization transfer region, and
a coil assembly, in particular an RF coil assembly, for generating an oscillating magnetic field within the holding chamber.

The inventive apparatus provides both a dedicated polarization generation region, with the sample holder for the solid sample, and a dedicated polarization transfer region, with the holding chamber for the liquid sample. By this means, the equipment for generating hyperpolarization on the short T1 nuclei of the sample and the equipment for transferring the polarization form the short T1 nuclei to the long T1 nuclei can be spaced apart and optimized for their respective purpose. In general, for generating the hyperpolarization in the short T1 nuclei, a strong static magnetic field is required. This field is provided by the magnet. The magnet is typically suitable for generating a static magnetic field $B_0 \geq 1.0$ T, preferably $B_0 \geq 4.0$ T, and even more preferably $B_0 \geq 6.7$ T. In the cryostat, the sample may be kept at a temperature of 90 K or lower, preferably 20K or lower, most preferably 4.2 K or lower; the apparatus contains or is connected to suitable cooling means for this purpose. For transferring the polarization, the apparatus is equipped with a coil assembly for applying Cross Polarization. Note that the polarization generation region spans at least the sample holder, and the polarization transfer region spans at least the holding chamber.

In a preferred embodiment of the inventive apparatus, for polarizing a sample within the sample holder in the polarization generation region by DNP, the apparatus further comprises a microwave container located within the cryostat, wherein the sample holder is located within the microwave container. DNP allows a relatively quick and simple hyperpolarization of the short T1 nuclei in the solid sample. The microwave container allows a reliable exposure of the solid sample with microwave radiation. The microwave container is typically connected to a microwave source via a microwave conduit. The microwave container can for instance be an over-moded a cavity or a cage structure.

In another embodiment, for polarizing a sample within the sample holder in the polarization generation region by Brute Force, the apparatus further comprises a cooling means for cooling the sample holder to a cryogenic temperature $T_{cr} \leq 40$ mK, preferably $T_{cr} \leq 20$ mK, most preferably $T_{cr} \leq 10$ mK, in particular wherein the cooling means comprises a dilution refrigerator, and the magnet is suitable for generating a static magnetic field $B_0 \geq 10$T, preferably $B_0 \geq 15$ T, most preferably $B_0 \geq 20$ T, in the polarization generation region. The apparatus allows a high polarization level of the short T1 nuclei.

Further preferred is an embodiment wherein the field generating device comprises one or more electro magnets, in particular solenoidal electro magnets, and/or one or more permanent magnets separate from the magnet. The field generating device of this type, separate from (i.e. not included or integrated in) the magnet, allows the generation of an optimized static magnetic field $B_0^*$ in the polarization transfer region, independent from the magnet.

In another advantageous embodiment, the field generating device is at least partially included and/or integrated into the magnet, in particular wherein the field generating device comprises one or more ferromagnetic structures coupled to the magnet or its stray field. This keeps the apparatus simple. Examples for suitable ferromagnetic structures are given in U.S. Pat. No. 8,154,292 B2. For example, axially symmetric tube type ferromagnetic structures, in particular narrowing at their end facing away from the magnet, may be used in accordance with the invention.

A preferred embodiment provides that the apparatus comprises a sample positioning device for placing the sample holder within the cryostat. This simplifies the positioning relative to the magnet or its static magnetic field, respectively. The sample positioning device may in particular comprise a rod arrangement.

Also preferred is an embodiment wherein the second conduit has a length of 50 cm or less, preferably 25 cm or less, most preferably 15 cm or less between the sample container and the holding chamber. With such a short second conduit, the transfer of the sample from the sample holder to the holding chamber may be particularly quick, and polarization decay between steps b) and d) may be minimized.

Particularly preferred is an embodiment wherein the holding chamber as well as the field generating device and the coil assembly are located within a room temperature bore of a cryostat of the magnet, in particular above the sample holder. This apparatus design is particularly simple, inexpensive and allows a good access to the polarization transfer region. Further, the sample is at or close to room temperature after the polarization transfer, avoiding or reducing delays for further use due to necessary heating or cooling, e.g. before application to a living human or animal patient.

Also within the scope of the present invention is the use of an above described inventive apparatus or one of its embodiments in an above described inventive method or one of its variants.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
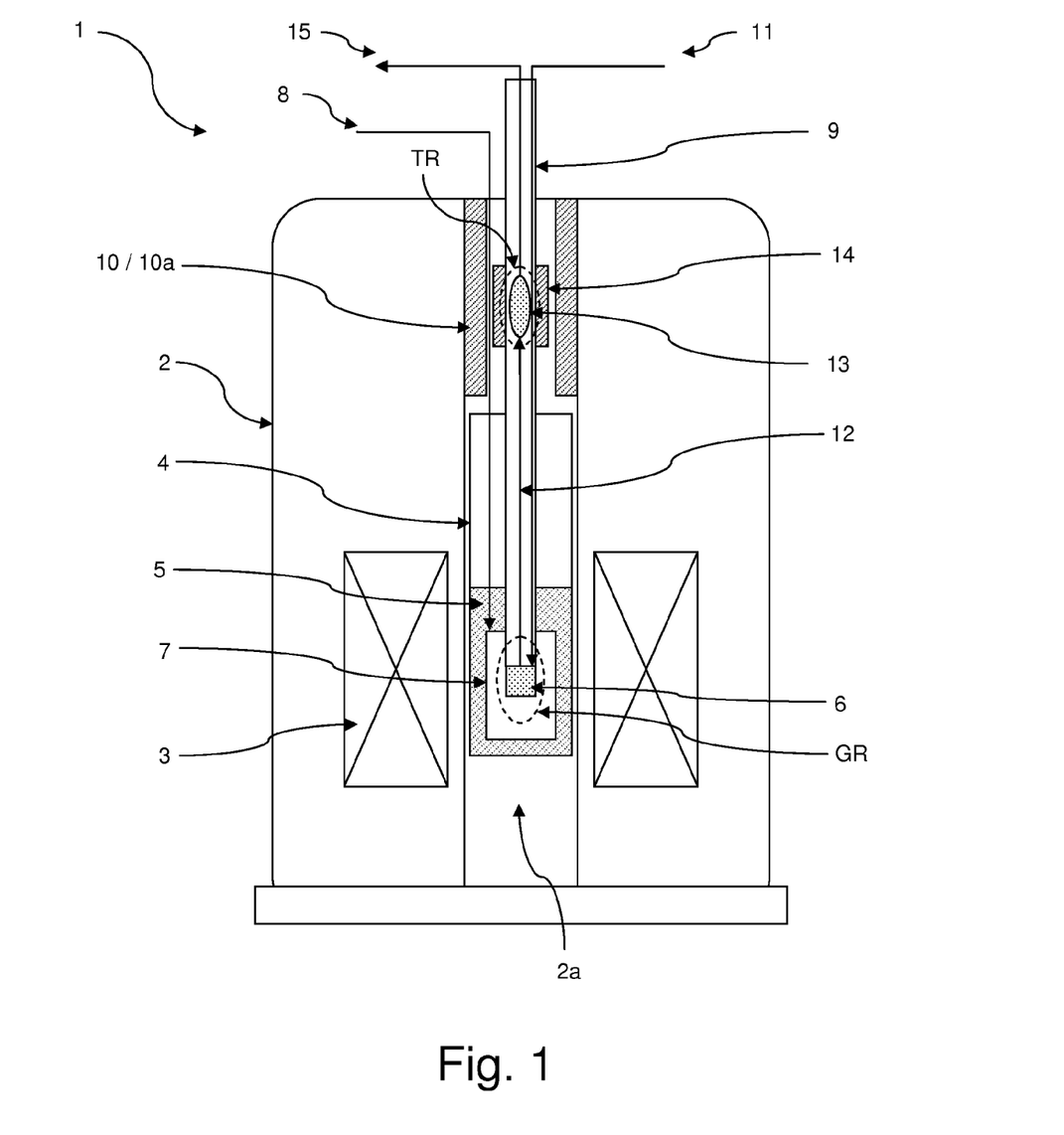
FIG. 1 shows a schematic cross-section of a first embodiment of an inventive apparatus equipped with a microwave container for DNP on the solid sample, and a field generating device with a solenoidal electro magnet.
Figure 2:
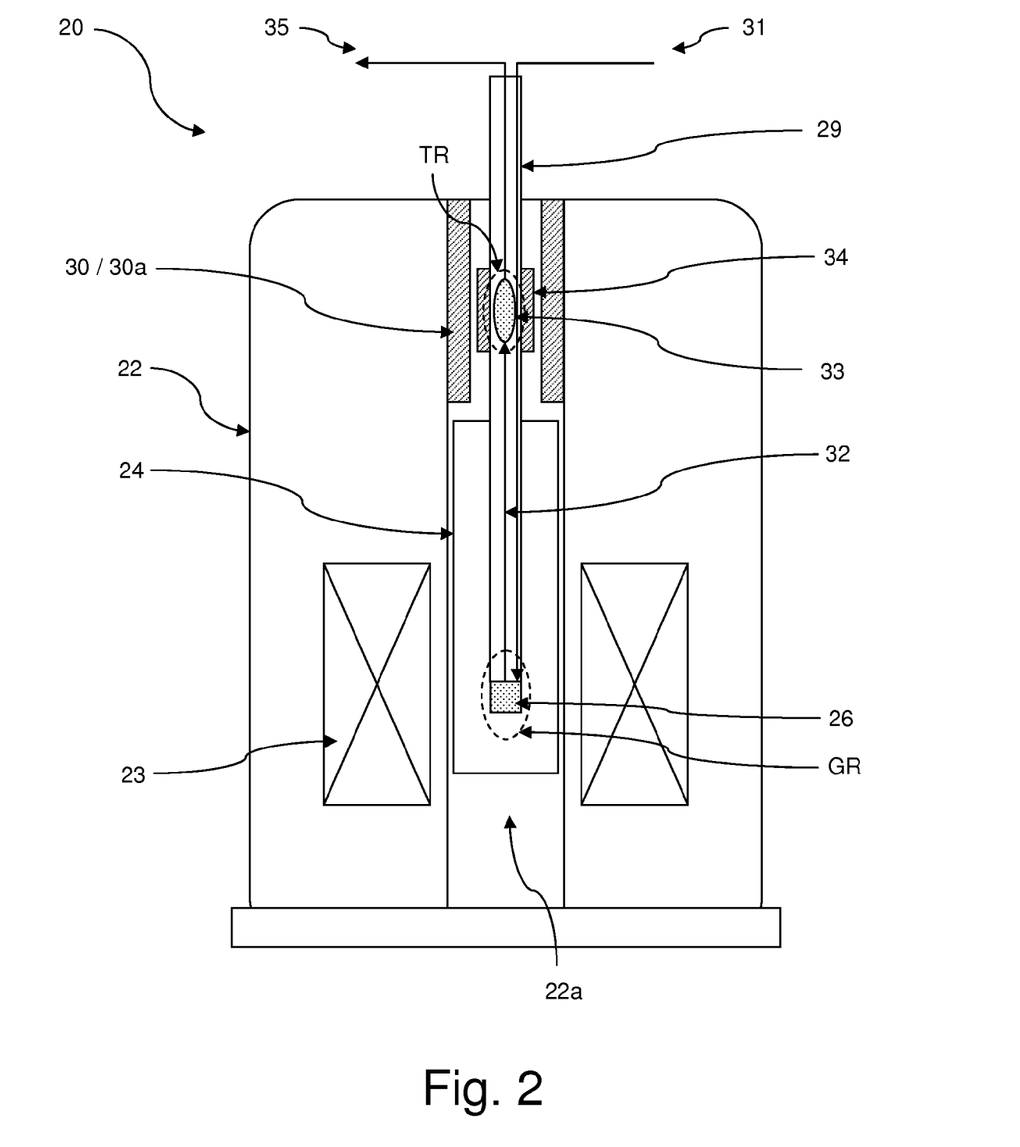
FIG. 2 shows a schematic cross-section of a second embodiment of an inventive apparatus equipped with an ultra low temperature cryostat for Brute Force hyperpolarization on the solid sample, and a field generating device with a solenoidal electro magnet.
Figure 3:
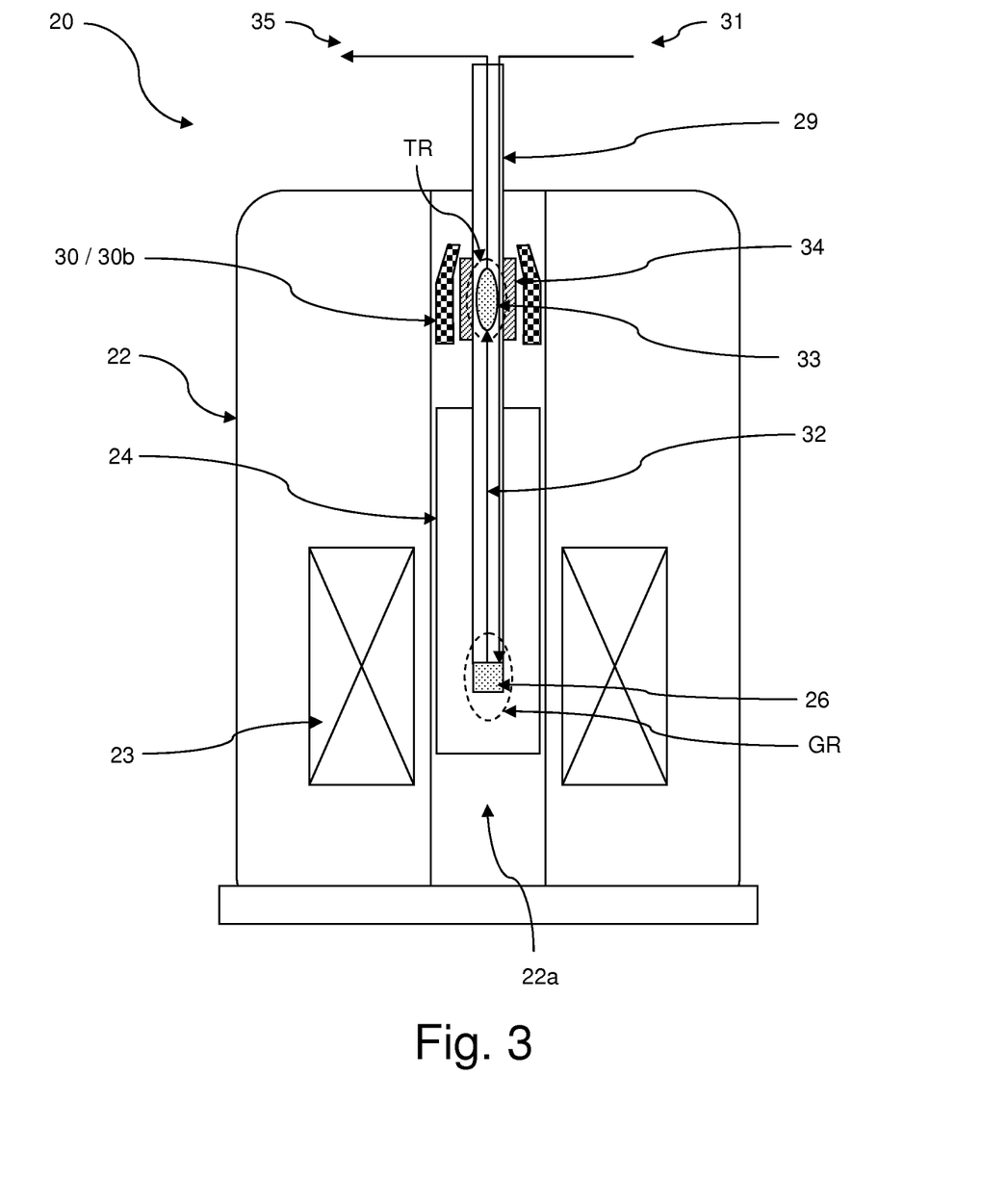
FIG. 3 shows a schematic cross-section of a third embodiment of an inventive apparatus equipped with an ultra low temperature cryostat for Brute Force hyperpolarization on the solid sample, and a field generating device with ferromagnetic structures.

FIGS. 1 through 3 illustrate by way of example embodiments of an inventive apparatus, suitable for performing an inventive method for producing a hyperpolarized sample.

An inventive apparatus makes use of two regions of different static magnetic field. One moderately homogeneous high field region (or polarization generation region) is used for hyperpolarization such as for example by Brute Force hyperpolarization or DNP. This region comprises means for the generation of low or very low temperatures and, in the latter case, for the supply of microwave energy. A low field, moderately homogeneous region (or polarization transfer region) is used for hyperpolarization transfer in the liquid phase and comprises means for performing Cross Polarization, typically including RF coils. In the illustrated examples, protons are used as short T1 nuclei, and $^{13}C$ are used as long T1 nuclei, but other elements as described above may be worked with, too.

The apparatus 1 illustrated in FIG. 1 comprises a magnet cryostat 2 containing a superconductive magnet 3 for the generation of a static magnetic field $B_0$ for DNP in a polarization generation region GR. Within the bore 2a of the magnet 3 or magnet cryostat 2, respectively, is placed a sample cryostat 4 (also referred to simply as cryostat) in which is maintained a bath of liquid helium 5 by means of cryogenic components for the supply of liquid helium (not shown). The pressure in cryostat 4 is reduced by pumping means (not shown). By these means, a cryogenic temperature below 4.2K is maintained in the embodiment shown, which is well suitable for DNP.

A sample holder 6 containing the solid sample for DNP is placed inside a microwave container 7 which is submersed in the liquid helium bath 5. The container 7 is supplied with microwave energy via microwave conduit 8 which is connected to a microwave source (not shown). The sample holder 6 can be introduced into the container 7 by means of sample positioning device 9, here of hollow tube type. The sample holder 6 is positioned within the polarization generation region GR, in which the homogenous static magnetic field $B_0$ is present; this is roughly at the center of the magnet 3.

Above the cryostat 4 and within the bore 2a, and therefore at room temperature, in close proximity to the DNP magnet 3, a polarization transfer region TR of a static homogeneous magnetic field $B_0^*$ is set up by means of a field generating device 10, which is realized here as a solenoidal electro magnet 10a. Other examples of field generating devices suitable for use according to the inventive method are permanent magnets, or, in conjunction with the stray field of the DNP magnet, appropriately dimensioned ferromagnetic structures (e.g. tubes).

The solid sample, after completion of DNP polarization, is brought into the liquid phase by dissolving it in a solvent which is supplied to the sample holder 6 by a first transfer conduit (or solvent conduit) 11. For simplification, a solvent reservoir from which solvent is taken, to be connected at the upper end of the first transfer conduit 11, is not shown. The dissolved sample is transported via a second transfer conduit 12 to a holding chamber 13 within the polarization transfer region TR. According to the inventive method, the travelling distance from sample holder 6 to the holding chamber 13 along the second transfer conduit 12 is short (typically 50 cm or less), such as to minimize the transfer time from the sample holder 6 to the holding chamber 13 and thereby the loss of proton polarization.

The holding chamber 13 is placed at the center of a coil assembly, here an RF coil assembly 14 (RF: radio frequency). The RF coil assembly 14 comprises a double tuned RF coil or a plurality of RF coils, tuned to both proton and $^{13}C$ resonance frequencies in the field $B_0^*$ of field generating device 10. The RF coil assembly 14 is connected to an RF pulse sequence generator (not shown) for the application of a liquid state polarization transfer pulse sequence such as INEPT, thereby transferring the polarization from protons to $^{13}C$ by Cross Polarization.

Following the polarization transfer, the liquid sample is transported further via a third transfer conduit 15 to a device (not shown) for the measurement of NMR data such as MRS data (MRS: magnetic resonance spectroscopy) or MRI data.

As a further example, an embodiment of an inventive apparatus is described with reference to FIG. 2. This apparatus 20 allows performing the inventive method in conjunction with Brute Force polarization.

The apparatus 20 comprises a magnet cryostat 22 containing a superconductive magnet 23 for the generation of a static magnetic field $B_0$ for Brute Force polarization. Within the bore 22a of the magnet 23 or its magnet cryostat 22, respectively, is placed an ultra low temperature sample cryostat 24 (also referred to simply as cryostat), for instance comprising a dilution refrigerator (not shown in detail). In the example shown, $B_0$ is 10 Tesla or more, and the cryogenic temperature Tcr within the cryostat 24 is 40 mK or less.

A sample holder 26 containing the solid sample for Brute Force polarization is placed inside the cryostat 24. The sample holder 26 can be introduced into the cryostat 24 by means of sample positioning device 29, here of hollow tube type.

The sample holder 26 is positioned within the polarization generation region GR, in which the homogenous static magnetic field $B_0$ is present.

Above the cryostat 24 and within the bore 22a, and therefore at room temperature, in close proximity to the Brute Force polarization magnet 23, a polarization transfer region TR of a static homogeneous magnetic field $B_0^*$ is generated by means of a field generating device 30, which is realized here as a solenoidal electro magnet 30a. Other examples of field generating devices suitable for use according to the inventive method are permanent magnets, or, in conjunction with the stray field of the Brute Force magnet 23, appropriately dimensioned ferromagnetic structures (e.g. tubes).

The solid sample, after completion of Brute Force polarization, is brought into the liquid phase by dissolving it in a solvent which is supplied to sample holder 26 by a first transfer conduit (or solvent conduit) 31. For simplification, a solvent reservoir from which solvent is taken, to be connected at the upper end of the first transfer conduit 31, is not shown. The dissolved sample is transported via a second transfer conduit 32 to a holding chamber 33 within the polarization transfer region TR. According to the inventive method, the travelling distance from sample holder 26 to the holding chamber 33 along the second transfer conduit 32 is short (typically 50 cm or less), such as to minimize the transfer time from sample holder 26 to the holding chamber 33 and thereby the loss of proton polarization.

The holding chamber 33 is placed at the center of a coil assembly, here an RF coil assembly 34. The RF coil assembly 34 comprises of a double tuned RF coil or a plurality of RF coils, tuned to both proton and $^{13}C$ resonance frequencies in the field $B_0^*$ of field generating device 30. The RF coil assembly 34 is connected to an RF pulse sequence generator (not shown) for the application of a liquid state polarization transfer pulse sequence such as INEPT, thereby transferring the polarization from protons to $^{13}C$ by Cross Polarization.

Following the polarization transfer, the liquid sample is transported further via a third transfer conduit 35 to a device (not shown) for the measurement of NMR data such as MRS data (MRS: magnetic resonance spectroscopy) or MRI data.

FIG. 3 illustrates an inventive apparatus 20 similar to the one shown in FIG. 2, so only the major differences are discussed in the following.

In the example of FIG. 3, the field generating device 30 comprises a ferromagnetic structure 30b coupled to the stray field of the Brute Force magnet 23. By this means, a defined and homogenous static magnetic field $B_0^*$ is maintained in the polarization transfer region TR. The polarization transfer, which is done by Cross Polarization by means of the RF coil assembly 34, takes place in this static magnetic field $B_0^*$.

Figure 4:
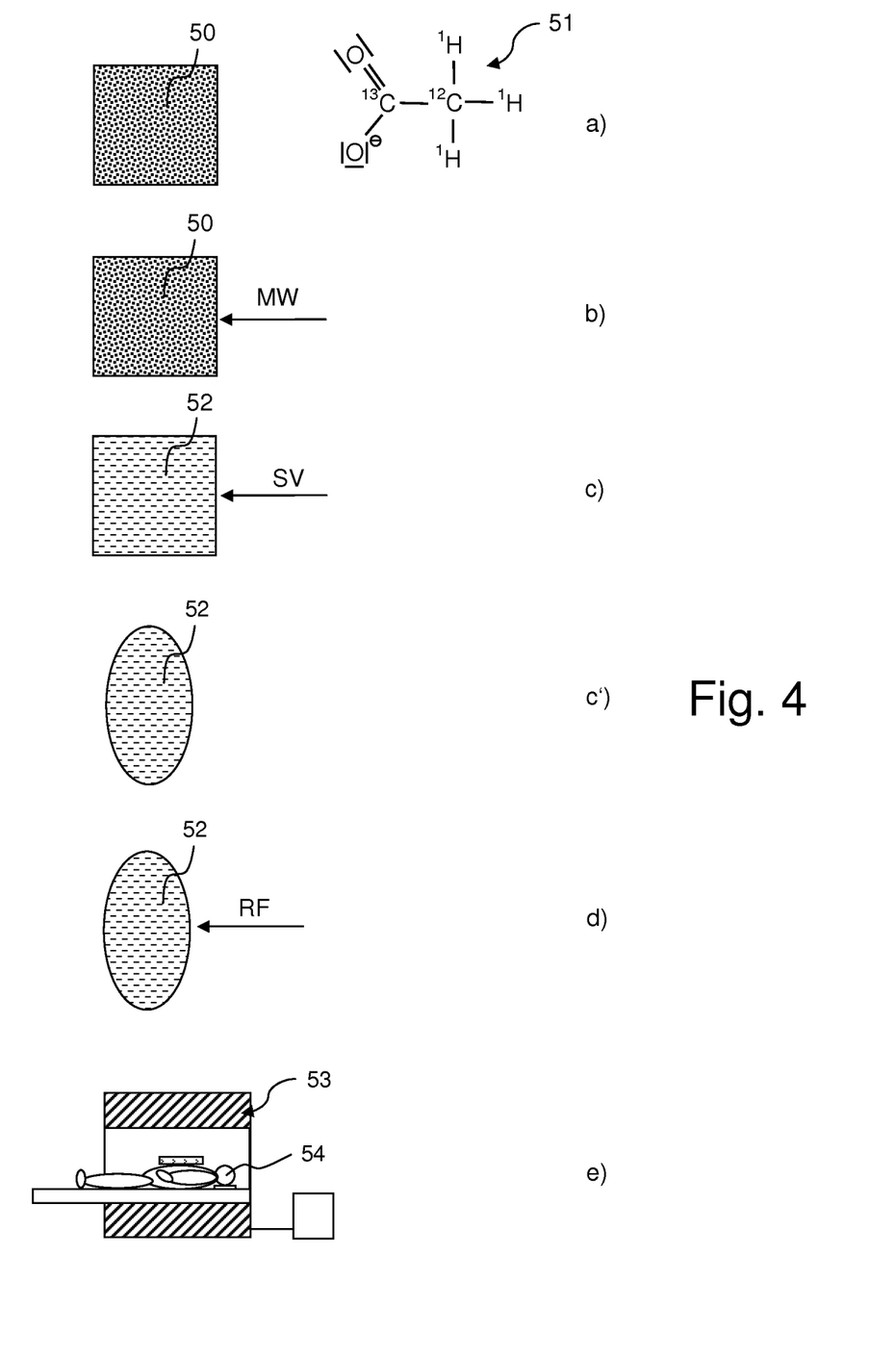
FIG. 4 shows a schematic diagram illustrating the inventive method by way of example.

In FIG. 4, the course of the inventive method for producing a hyperpolarized sample is illustrated by way of example. The method provides a hyperpolarized solution of a long T1 agent for use in magnetic resonance investigations.

In a first step, compare a) in FIG. 4, a solid sample 50 containing a type of molecule 51 (in the illustrated example acetate; note that the molecule may be ionized in accordance with the invention) which contains both a long T1 nucleus (here $^{13}C$) and a short T1 nucleus (here $^1H$) is provided. In the figure, the $^1H$ (contained three times) and $^{13}C$ are linked in the molecule 51 via two bonds, which is preferred; however the short T1 and long T1 nuclei may also be closer together or further apart in the molecule. In general, one, two, three or four bonds in sequence between a short T1 nucleus and a long T1 nucleus are preferred. Note that a molecule for the inventive method may contain one or more short T1 nuclei and one or more long T1 nuclei. The sample 50 may be cooled in order to assume a solid state.

As a next step, the short T1 nuclei (here $^1H$) in the molecules 51 are hyperpolarized to a desired, high level, e.g. 50% or higher. This may be done by DNP, with microwave radiation MV being irradiated to the solid sample 50, compare step b). Note that step b) typically takes place at a cryogenic Temperature $T_{cr}$, preferably on the order of 10 K or less.

Subsequently, the sample 50 is turned into the liquid phase, preferably by adding a solvent SV (such as hot water), resulting in a liquid sample 52, compare step c).

Typically, the liquid sample 52 is then transported from the polarization generation region (where step b) took place) to a polarization transfer region (where the next step d) shall take place), wherein said regions are distinguished at least by a difference in the static magnetic field present. In general, the static magnetic field $B_0^*$ in the polarization transfer region is less strong (such as at least 100 times less strong) as compared to the static magnetic field $B_0$ in the polarization generation region. Most often, in the polarization transfer region, there is a higher temperature T* as compared to $T_{cr}$ in the polarization generation region. The liquid sample 52 is typically conveyed to another container for this purpose, compare step c'). Note that this transport should be rapid, or more general, the time between steps b) and d) should be short, in order to minimize polarization loss of the short T1 nuclei; their polarization decay is much more pronounced as compared to long T1 nuclei.

Then the polarization transfer of the short T1 nuclei (here $^1H$) to the long T1 nuclei (here $^{13}C$) in the molecules is performed on the liquid sample 52 by Cross Polarization, with radio frequency pulses RF being irradiated to the liquid sample 52, compare step d) of FIG. 4. For example, an INEPT pulse sequence may be applied.

It should be noted that the requirements for a magnetic field in which the polarization transfer of step d) can take place are much different from those for (high resolution) NMR, both in terms of homogeneity and strength.

Subsequently, the liquid sample is transported once more to an NMR device 53 (here an MRI tomograph), and the magnetic resonance signal of the long T1 nuclei (here $^{13}C$) is measured, compare step e). In particular, the liquid sample may be applied to a living human or animal patient 54, for metabolic spectroscopy or metabolic imaging. If necessary, the liquid sample may be treated (for example filtered or degassed) before application to the living patient 54.

It should be noted that after step d), polarization decay is much slower as compared to after step b), since the polarization is now present in the long T1 nuclei. Therefore an apparatus for performing steps b) and d) may be spaced apart from the NMR device 53 in accordance with the invention; however time between step d) and step e) should in any case not be wasted unnecessarily.

We claim:

1. A method for producing a hyperpolarized sample for use in a magnetic resonance investigation, the method comprising the steps of:
   a) providing a solid sample containing long T1 nuclei and short T1 nuclei in same molecules;
   b) hyperpolarizing the short T1 nuclei in the solid sample;
   c) transforming the solid sample into a liquid sample; and
   d) transferring a polarization of the short T1 nuclei to the long T1 nuclei within the molecules in the liquid sample by Cross Polarization via J coupling.

2. The method of claim 1, wherein the polarizing in step b) causes a level of at least 1%, at least 5%, at least 20% or at least 50% of the short T1 nuclei contained in the solid sample to be polarized.

3. The method of claim 1, wherein step b) takes 30 minutes or less, 10 minutes or less or 3 minutes or less.

4. The method of claim 1, wherein, during step c), the solid sample is dissolved in a solvent.

5. The method of claim 1, wherein during or after step c), the solid or liquid sample is transported to a region with a lower static magnetic field as compared to a static magnetic field present during step b) and/or to a region with a higher temperature as compared to a cryogenic temperature present during step b).

6. The method of claim 5, wherein the liquid sample is transported by pushing or pulling through a conduit by means of over-or under-pressure.

7. The method of claim 1, wherein a longitudinal relaxation time of the long T1 nuclei is 5 s or longer, 10 s or longer, 30 s or longer or 60 s or longer and/or a longitudinal relaxation time of the long T1 nuclei is larger than two times, larger than five times or larger than ten times a longitudinal relaxation time of the short T1 nuclei.

8. The method of claim 1, wherein the long T1 nuclei are $^6$Li, $^{13}$C, $^{15}$N, $^{31}$P, $^{29}$Si, $^{89}$Y, $^{57}$Fe, $_{83}$Kr, $^{107}$Ag, $^{109}$Ag, $^{115}$Sn, $^{117}$Sn, $^{119}$Sn, $^{199}$Hg, $^{129}$Xe or $^{131}$Xe and/or the short T1 nuclei are $^1$H or $^{19}$F.

9. The method of claim 1, wherein, in step b) for polarizing the short T1 nuclei by Brute Force, the solid sample is exposed to a static magnetic field $B_0 \geq 10$ T, $B_0 \geq 15$ T or $B_0 \geq 20$ T, wherein the solid sample is at a cryogenic temperature $T_{cr} \leq 40$ mK, $T_{cr} \leq 20$ mK or $T_{cr} \leq 10$ mK.

10. The method of claim 1, wherein, in step b) for polarizing the short T1 nuclei by DNP, the solid also includes a polarizing agent and is exposed to microwave radiation and a static magnetic field $B_0$.

11. The method of claim 10, wherein the static magnetic field $B_0 \geq 4.0$ T or $B_0 \geq 6.7$ T and an EPR line of a polarizing agent has a width $w_{pa} > \frac{1}{2}\omega_{hg}$ or $W_{Pa} > \omega_{hg}$, with $w_{pa} = 2\sqrt{2\log 2} \cdot \sigma$, with $\sigma^2$ being a second moment of an EPR line and $\omega_{hg}$ being a Larmor frequency of the short T1 nuclei.

12. The method of claim 10, wherein during a DNP in step b), the solid sample is at a cryogenic temperature $T_{cr} \leq 20$ K, $T_{cr} \leq 10$ K, $T_{cr} \leq 4.2$ K or $T_{cr} \leq 1.5$ K.

13. The method of claim 10, wherein, during a DNP in step b), the solid sample (50) is at a cryogenic temperature $T_{cr} \geq 2.2$ K or $T_{cr} \geq 4.2$ K.

14. The method of claim 10, wherein a polarizing agent comprises nitroxyl radicals, TEMPO radicals or TEMPOL radicals.

15. The method of claim 1, wherein, during step d), the liquid sample is at room temperature.

16. A method of magnetic resonance investigation, comprising the steps of preparing a hyperpolarized sample using the method of claim 1, transporting the liquid sample to an NMR device or an MRI device, and measuring a magnetic resonance signal of the long T1 nuclei of the liquid sample or measuring a magnetic resonance signal of the long T1 nuclei for metabolic imaging.

17. An apparatus for producing a hyperpolarized sample in a magnetic resonance investigation, the apparatus comprising:
   a) means for providing a solid sample, containing long T1 nuclei and short T1 nuclei in same molecules;
   b) means for hyperpolarizing the short T1 nuclei in the solid sample;
   c) means for transforming the solid sample into a liquid sample; and
   d) means for transferring a polarization of the short T1 nuclei to the long T1 nuclei within the molecules in the liquid sample by Cross Polarization via j coupling.

18. The apparatus of claim 17, wherein the apparatus comprises:
   a magnet or a superconducting magnet suitable for generating a static magnetic field $B_0$ in a polarization generation region;
   a cryostat containing a sample holder for the sample in solid and liquid state, wherein the sample holder is located in the polarization generation region;
   a holding chamber for the sample in liquid state, located in a polarization transfer region separate from the polarization generation region;
   a first transfer conduit connecting a solvent reservoir with the sample holder;
   a second transfer conduit connecting the sample holder with the holding chamber;
   a field generating device suitable for generating a static magnetic field $B_0^*$ in the polarization transfer region; and
   a coil assembly or an RF coil assembly for generating an oscillating magnetic field within the holding chamber.

19. The apparatus of claim 18, wherein, for polarizing a sample within the sample holder by DNP in the polarization generation region, the apparatus further comprising a microwave container located within the cryostat, wherein the sample holder is located within the microwave container.

20. The apparatus of claim 18, wherein, for polarizing a sample within the sample holder by Brute Force in the polarization generation region, the apparatus further comprising a cooling means for cooling the sample holder to a cryogenic temperature $T_{cr} \leq 40$ mK, $T_{cr} \leq 20$ mK or $T_{cr} \leq 10$ mK, the cooling means comprising a dilution refrigerator and the magnet being suitable for generating a static magnetic field in the polarization generation region of $B_0 \geq 10$T, $B_0 \geq 15$ T or $B_0 \geq 20$ T.

21. The apparatus of claim 18, wherein the field generating device comprises one or more electro magnets or solenoidal electro magnets and/or one or more permanent magnets, separate from the magnet.

22. The apparatus of claim 18, wherein the field generating device is at least partially included and/or integrated into the magnet, wherein the field generating device comprises one or more ferromagnetic structures coupled to the magnet or to a stray field thereof.

23. The apparatus of claim 18, wherein the apparatus comprises a sample positioning device for placing the sample holder within the cryostat.

24. The apparatus of claim 18, wherein the second conduit has a length between the sample container and the holding chamber of 50 cm or less, 25 cm or less or 15 cm or less.

25. The apparatus of claim 18, wherein the holding chamber, the field generating device and the coil assembly are located within a room temperature bore of a cryostat of the magnet and above the sample holder.

* * * * *